United States Patent [19]

Kobayashi et al.

[11] Patent Number: 5,264,190
[45] Date of Patent: Nov. 23, 1993

[54] LIQUID PHASE EPITAXIAL FILM GROWTH APPARATUS

[75] Inventors: Masatosi Kobayashi; Yoshiharu Komine, both of Itami, Japan

[73] Assignee: Mitsubishi Denki Kabushiki Kaisha, Tokyo, Japan

[21] Appl. No.: 866,489

[22] Filed: Apr. 10, 1992

Related U.S. Application Data

[62] Division of Ser. No. 567,109, Aug. 14, 1990, Pat. No. 5,130,270.

[30] Foreign Application Priority Data

Apr. 19, 1990 [JP] Japan .................. 2-104037

[51] Int. Cl.⁵ .................................................. C30B 19/06
[52] U.S. Cl. .................................. 422/254; 118/415; 118/421
[58] Field of Search ............... 437/119, 120, 126, 128, 437/130, 108, 110; 118/415, 421; 148/DIG. 101; 422/245, 254; 156/621, 622, 624

[56] References Cited

U.S. PATENT DOCUMENTS

| | | | |
|---|---|---|---|
| 3,783,825 | 1/1974 | Kobayasi et al. | 118/421 |
| 3,897,281 | 7/1975 | Gilbert et al. | 118/415 |
| 3,972,753 | 8/1976 | Legros et al. | 148/171 |
| 4,013,040 | 3/1977 | Horikoshi | 118/415 |
| 4,123,302 | 10/1978 | Marinelli | 118/415 |
| 4,268,327 | 5/1981 | Uragaki et al. | 148/171 |
| 4,315,477 | 2/1982 | Wang et al. | 118/64 |
| 4,317,689 | 3/1982 | Bowers et al. | 148/171 |
| 4,366,771 | 1/1983 | Bowers et al. | 118/415 |
| 4,401,487 | 8/1983 | Lockwood | 148/171 |
| 4,470,368 | 9/1984 | Reynolds, Jr. et al. | 118/412 |
| 4,535,720 | 8/1985 | Brice et al. | 118/415 |
| 4,642,142 | 2/1987 | Harman | 148/171 |
| 4,706,604 | 11/1987 | Hager | 118/415 |
| 4,755,364 | 7/1988 | La Chapelle, Jr. et al. | 118/415 |
| 4,798,812 | 1/1989 | Wilson | 437/119 |
| 4,906,325 | 3/1990 | Bernardi | 156/621 |

FOREIGN PATENT DOCUMENTS

| | | |
|---|---|---|
| 0295659 | 12/1988 | European Pat. Off. . |
| 0311038 | 4/1989 | European Pat. Off. . |
| 54-104773 | 8/1979 | Japan .................. 118/415 |
| 55-96629 | 7/1980 | Japan . |
| 58-131737 | 8/1983 | Japan . |
| 63-307199 | 12/1988 | Japan . |
| 2138697 | 10/1984 | United Kingdom . |

*Primary Examiner*—Mary Wilczewski
*Attorney, Agent, or Firm*—Leydig, Voit & Mayer

[57] ABSTRACT

An apparatus for liquid phase epitaxial film growth includes a mother boat for supporting a substrate, a melt boat slidable on the mother boat for containing a melt and selectively bringing the substrate and the melt into contact, and a lid for opening and closing the melt boat. The mother boat is disposed in a quartz tube and push rods extend into the tube for sliding the lid to open and close the melt boat.

6 Claims, 3 Drawing Sheets

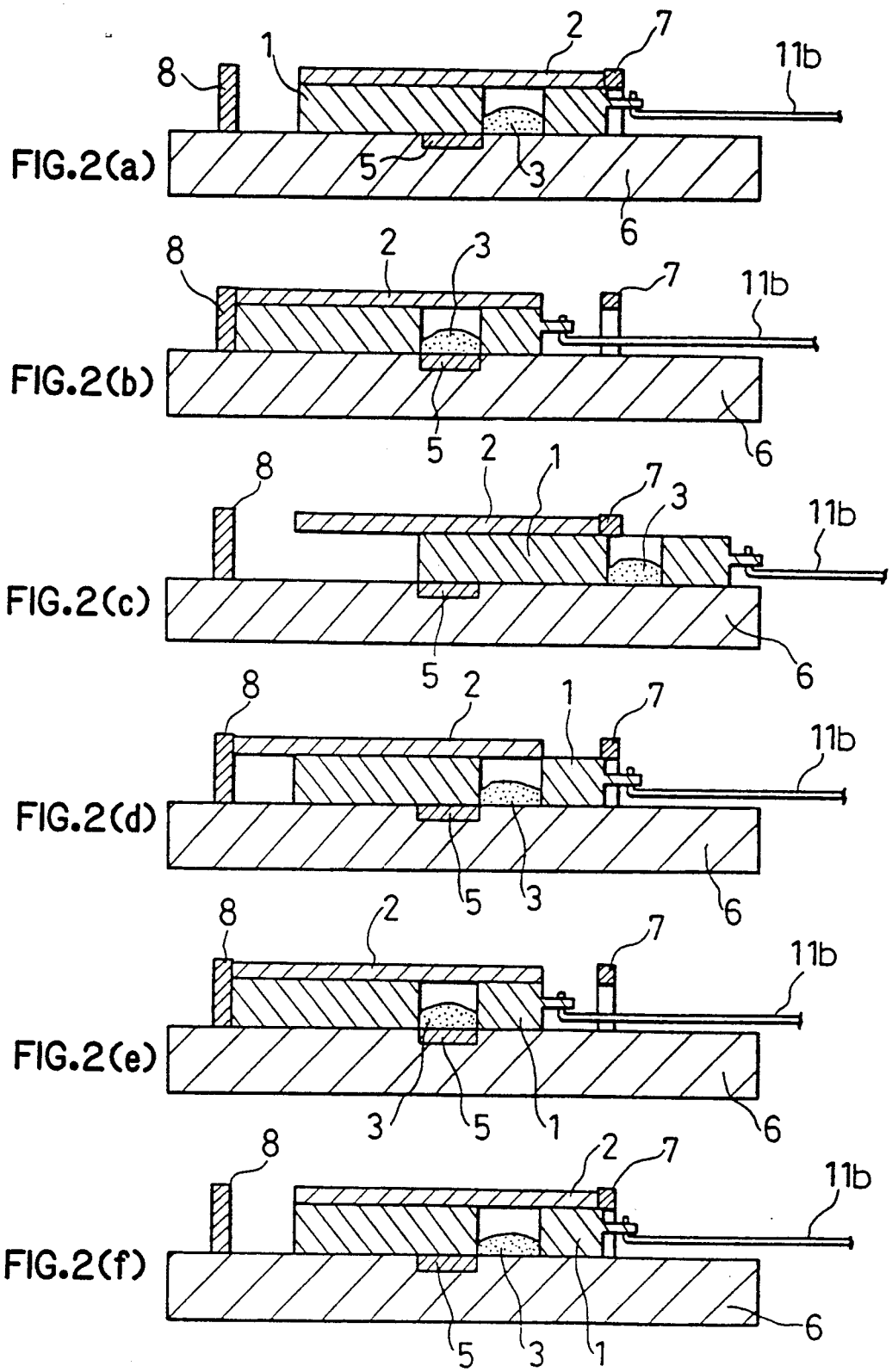

FIG.4
(PRIOR ART)
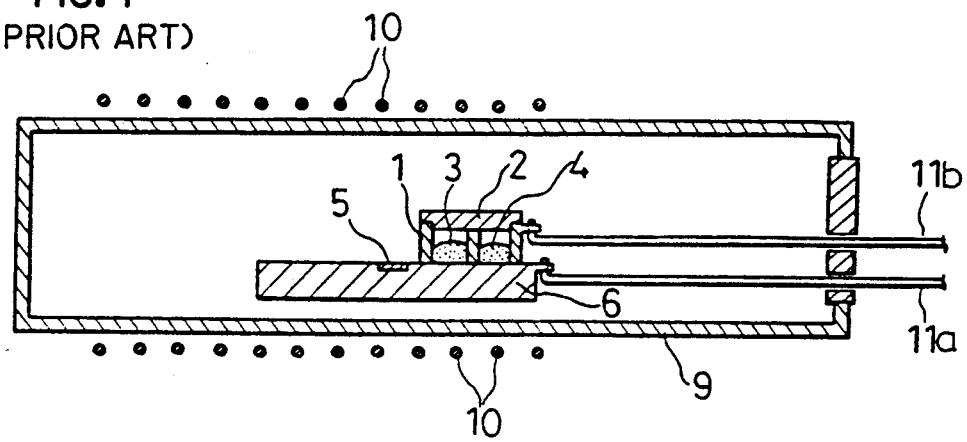
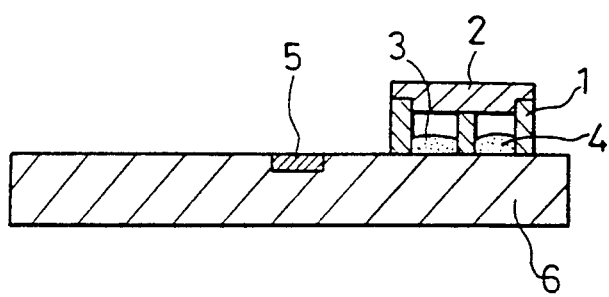
FIG.5(a)
(PRIOR ART)
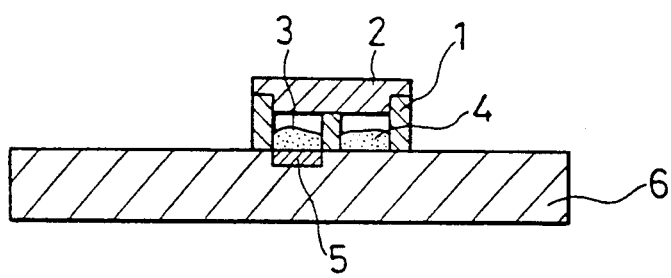
FIG.5(b)
(PRIOR ART)
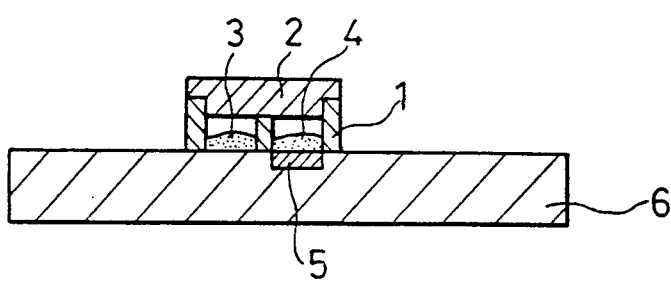
FIG.5(c)
(PRIOR ART)
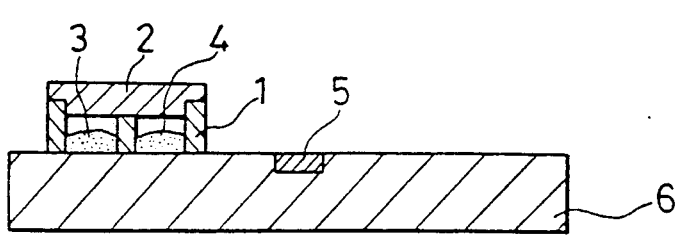
FIG.5(d)
(PRIOR ART)

5,264,190

LIQUID PHASE EPITAXIAL FILM GROWTH APPARATUS

This application is a division of application Ser. No. 07/567,109, filed Aug. 14, 1990, now U.S. Pat. No. 5,130,270.

FIELD OF THE INVENTION

The present invention relates to a hetero-epitaxial liquid phase growth method for growing compound semiconductors by a liquid phase epitaxy growth to produce hetero-epitaxial layers.

BACKGROUND OF THE INVENTION

FIG. 4 shows a prior art liquid phase crystal growth apparatus for hetero-epitaxial liquid phase growth. In FIG. 4, reference numeral 1 designates a melt boat and a lid 2 is provided on the melt boat 1 to enclose the boat 1. Reference numeral 3 designates a first melt of a compound semiconductor contained in the first room of the boat 1 and reference numeral 4 designates a second melt of a compound semiconductor having a composition different from the first melt 3 contained in the second room of the boat 1. Reference numeral 6 designates a mother boat and reference numeral 5 designates a substrate placed in a concave part on the surface of the mother boat 6. Reference numeral 9 designates a quartz tube and this quartz tube 9 is heated by a heater 10. Reference numerals 11a and 11b designate a moving rod for moving the mother boat 6 and the melt boat 1, respectively.

The prior art liquid phase growth process will be described.

FIGS. 5(a)–5(d) show a prior art hetero-epitaxial liquid phase growth method.

FIG. 5(a) shows a state where temperature adjustment is carried out. The first melt 3 and the second melt 4 are airtightly enclosed by the melt boat 1 and the lid 2 and they are positioned to one side of the substrate 5 which is placed on the mother boat 6 and are held in the melted state for a predetermined time.

Next, the entire boat, that is, the melt boat 1 and the mother boat 6 are cooled to lower its temperature at a predetermined speed, and when it reaches a predetermined temperature, the melt boat 1 is pushed by the moving rod 11b to a state shown in FIG. 5(b) such that the first melt 3 contacts the substrate 5. Then, a first layer epitaxial thin film is grown on the substrate 5.

Next, the melt boat 1 is pushed further by the moving rod 11b to a state shown in FIG. 5(c) such that the second melt 4 is made in contact with the substrate 5 on which the first layer epitaxial thin film has been grown. Then, a second layer epitaxial thin film is grown on the first layer epitaxial thin film.

Finally, the melt boat 1 is further slided by the moving rod 11b to a state shown in FIG. 5(d), and the substrate 5 is separated from the first and second melt 3 and 4, thereby completing the growth.

In the prior art example, the first layer thin film is epitaxially grown by using the first melt 3 and the second layer thin film is epitaxially grown by using the second melt 4.

In the prior art hetero-epitaxial liquid phase growth method, it is necessary to prepare a plurality of melts having different composition for the hetero-epitaxial growth. Therefore, the melt production requires a lot of work and the materials are expensive.

SUMMARY OF THE INVENTION

The present invention is directed to solving the above described problems and has for its object to provide a hetero-epitaxial liquid phase growth method that uses one kind of melt.

Other objects and advantages of the present invention will become apparent from the detailed description given hereinafter; it should be understood, however, that the detailed description and the specific embodiment are given by way of illustration only, since various changes and modifications within the spirit and the scope of the invention will become apparent to those skilled in the art from this detailed description.

In accordance with a hetero-epitaxial liquid phase growth method of the present invention, after a first thin film is epitaxially grown by placing melt on a substrate, a predetermined quantity of easily evaporating component in the melt is evaporated while keeping the lid of the melt boat open for a predetermined time, and thereafter, the melt is again placed on the substrate and a second thin film is epitaxially grown.

Therefore, the composition of the melt changes by evaporating a predetermined quantity of the easily evaporating melt component, and a thin film of different composition can be hetero-epitaxially grown by using only one melt.

BRIEF DESCRIPTION OF THE DRAWINGS

FIGS. 2(a) to 2(f) are cross-sectional views showing a hetero-epitaxial liquid phase growth method according to an embodiment of the present invention;

FIG. 4 is a cross-sectional view showing a liquid phase crystal growth apparatus used in a prior art hetero-epitaxial liquid phase growth method; and FIGS. 5(a) to 5(d) are cross-sectional views showing a prior art hetero-epitaxial liquid phase growth method.

DETAILED DESCRIPTION OF THE PREFERRED EMBODIMENT

An embodiment of the present invention will be described in detail with reference to the drawings.

Figure 1:
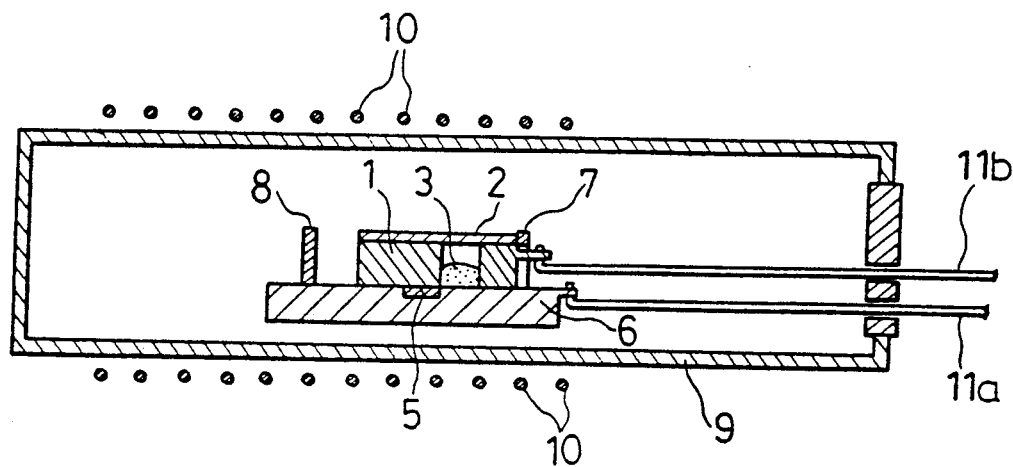
FIG. 1 is a cross-sectional view showing a liquid phase crystal growth apparatus used in a hetero-epitaxial liquid phase growth method according to an embodiment of the present invention.

FIG. 1 is a cross-sectional view showing a liquid phase crystal growth apparatus used in a hetero-epitaxial liquid phase growth method according to an embodiment of the present invention. In FIG. 1, the same reference numerals as those shown in FIG. 4 designate the same or corresponding portions.

Reference numeral 7 designates a gate shaped lid stop which stops the lid 2 but allows the melt boat 1 to pass therethrough. Reference numeral 8 designates a stop that stops both the melt boat 1 and the lid 2.

The liquid phase crystal growth process will be described.

FIGS. 2(a)–2(f) are diagrams showing the processes of a hetero-epitaxial liquid phase growth method according to an embodiment of the invention. The same reference numerals as those shown in FIG. 1 designate the same or corresponding portions.

FIG. 2(a) shows a state where temperature adjustment is carried out. The melt 3 airtightly enclosed by the melt boat 1 and the lid 2 are located to one side of the substrate 5 which is placed on the mother boat 6 and is held in a melted state for a predetermined time. Next, the entire boat, that is, the mother boat 6 and the melt boat 1 are cooled at a constant speed to lower the temperature of the melt. When it reaches a predetermined temperature, the melt boat 1 is pushed by the moving rod 11b to a state shown in FIG. 2(b) such that the melt 3 contacts the substrate 5. Then, a first epitaxial thin film is grown on the substrate 5.

Next, the melt boat 1 is pulled by the moving rod 11b to a state shown in FIG. 2(c). Then, the substrate 5 and the melt 3 ar separated and the first growth is completed. Then, the lid 2 is stopped by the lid stop 7, so that the lid 2 is opened as shown in the FIG. 2(c). An easily evaporating component is evaporated from the melt 3. The device is held in this state for a predetermined time, and thereafter the melt boat 1 is pushed by the moving rod 11b to a state shown in FIG. 2(d).

In FIG. 2(d), the lid 2 is stopped by the melt boat and lid stop 8, and the lid 2 again covers the melt 3, and the melt 3 is airtightly enclosed. The device is further cooled to lower its temperature in this state, and after the melt 3 from which a quantity of easily evaporating component is evaporated reaches a solid/liquid equilibrium state with the first thin film, the melt boat 1 is further pushed by the moving rod 11b to a state shown in FIG. 2(e). In FIG. 2(e), the melt 3 is again positioned on the substrate 5 and a second thin film is epitaxially grown on the first thin film.

Finally, the melt boat 1 is further pulled by the moving rod 11b to a state shown in FIG. 2(f) and the substrate 5 is separated from the melt 3, thereby completing the growth.

In this embodiment, in the state of FIG. 2(c), a quantity of the easily evaporating component of the melt 3 is evaporated and the composition of melt 3 changes. Therefore, the composition of the first thin film and that of the second thin film are differentiated, thereby resulting in a hetero-epitaxial growth. For example, a p type mercury cadmium telluride having a mole ratio of mercury to cadmium of 0.8:0.2 is epitaxially grown on the semi-insulating CdTe substrate, and further, a p type mercury cadmium telluride having a mole ratio of mercury to cadmium of 0.78:0.22 is epitaxially grown thereon to produce an infrared detector. When a melt of mercury cadmium telluride having a mole ratio of mercury to cadmium of 0.8:0.2 is used as melt, a quantity of mercury which is the easily evaporating component of the melt is evaporated as described above, and then the mol ratio of mercury to cadmium of the melt becomes 0.78:0.22. Then, by growing the first layer for about 30 minutes at a temperature of about 480° C., a thin film of mercury cadmium telluride about 20 microns thick is produced and after a quantity of mercury is evaporated by opening the lid for several minutes, the melt is again brought into contact with the CdTe substrate on which a $Cd_{0.2}Hg_{0.8}Te$ of about 20 microns is crystalline grown. Then, the crystal growth is carried out for about 15 minutes, thereby producing a $Cd_{0.22}Hg_{0.78}Te$ thin film about 5 microns thick on the $Cd_{0.2}Hg_{0.8}Te$ thin film.

Figure 3:
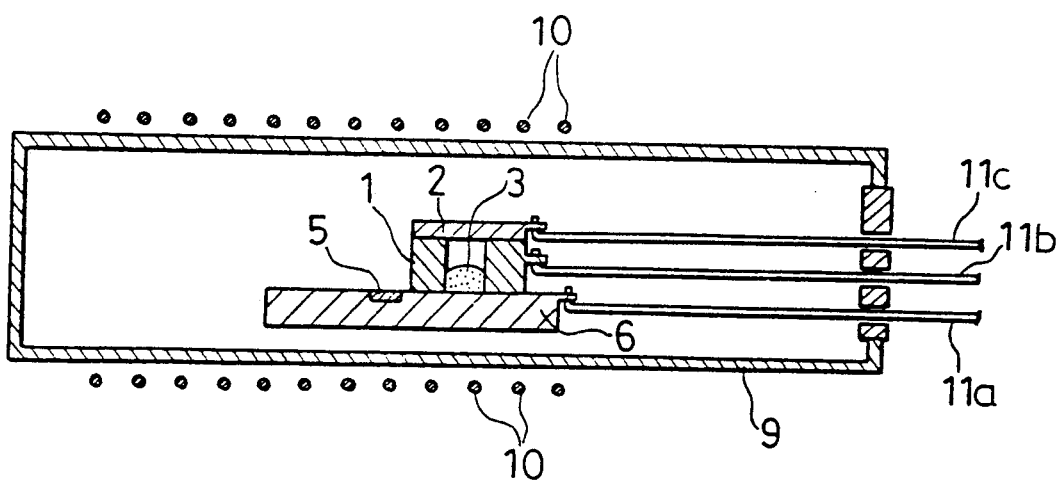
FIG. 3 is a cross-sectional view showing an alternative liquid phase crystal growth apparatus used in a hetero-epitaxial liquid phase growth method according to an embodiment of the present invention.

While in the above illustrated embodiment, the lid stop 7 and the melt boat and lid stop 8 are used to open or close the lid 2, the lid 2 can be opened or closed by sliding the lid 2 with a moving rod 11c as shown in FIG. 3.

As is evident from the foregoing description, according to the present invention, in a hetero-epitaxial liquid phase growth method, after a first thin film is epitaxially grown, a predetermined quantity of an easily evaporating component of the melt is evaporated, and thereafter, the melt is again placed on the substrate to carry out epitaxial growth of a second thin film. Therefore, the composition of the melt changes by evaporating a predetermined quantity of the easily evaporating component in the melt, and a thin film of different composition can be hetero-epitaxially grown using one kind of melt. Therefore, melt production is simplified and the cost of materials is also reduced.

What is claimed is:

1. A liquid phase crystal growth apparatus comprising:
   a quartz tube;
   a heater for heating the quartz tube;
   a mother boat for supporting a substrate on which hetero-epitaxial layers are to be grown inside the quartz tube;
   a melt boat including a melt chamber for containing a melt, the melt boat being slidably disposed on and in contact with the motor boat for selectively contacting a melt in said melt boat with a substrate supported on the mother boat;
   a lid slidably disposed on and in contact with the said melt boat and movable between a closed position enclosing a melt within the melt chamber and an open position in which the melt within the melt chamber is exposed to an ambient within the quartz tube; and
   a first stopper for stopping movement of the lid but not of the melt boat when the melt boat slides on the mother boat in a first direction.

2. A liquid phase crystal growth apparatus as defined in claim 1 wherein said first stopper is mounted on the mother boat and includes an opening for passage of the melt boat and a portion adjoining the opening for blocking movement of the lid as the melt boat passes through the opening.

3. A liquid phase crystal growth apparatus as defined in claim 1 including a rod connected to the melt boat for sliding the melt boat on the mother boat from outside the quartz tube.

4. A liquid phase crystal growth apparatus as defined in claim 1 comprising a second stopper for stopping movement of the melt boat and of the lid on the mother boat in a second direction opposite the first direction.

5. A liquid phase crystal growth apparatus as defined in claim 4 wherein the first and second stoppers are separated on the mother boat by a distance greater than a length of the lid along the first direction.

6. A liquid phase crystal growth apparatus as defined in claim 4 wherein the first and second stoppers are mounted on the mother boat.

* * * * *